United States Patent
Ali et al.

[11] Patent Number: 5,215,602
[45] Date of Patent: Jun. 1, 1993

[54] WATER-SOLUBLE FLUX

[75] Inventors: Mir K. Ali, Schaumburg, Ill.; Chia C. Chang, Parsippany-Troy Hills Township, Morris County, N.J.

[73] Assignees: AT&T Bell Laboratories, Murray Hill, N.J.; London Chemical Company, Bensenville, Ill.

[21] Appl. No.: 887,762

[22] Filed: May 29, 1992

[51] Int. Cl.⁵ .............................................. B23K 35/34
[52] U.S. Cl. ........................................ 148/23; 148/24; 148/25
[58] Field of Search ................................. 148/23–25

[56] References Cited

U.S. PATENT DOCUMENTS

| | | |
|---|---|---|
| 3,748,191 | 7/1973 | Siegfried ................................ 148/23 |
| 4,077,815 | 3/1978 | Schuessler ............................. 148/23 |
| 4,113,524 | 9/1978 | Katz ...................................... 148/23 |
| 4,115,157 | 9/1978 | Packer ................................... 148/23 |
| 4,151,015 | 4/1979 | Cooper .................................. 148/23 |
| 4,216,035 | 8/1980 | Bakos et al. .......................... 148/23 |
| 4,478,650 | 10/1984 | Zado ..................................... 148/23 |
| 4,940,498 | 7/1990 | Rubin ................................... 148/23 |
| 5,009,724 | 4/1991 | Dodd et al. ........................... 148/23 |

*Primary Examiner*—Peter D. Rosenberg
*Attorney, Agent, or Firm*—L. H. Birnbaum

[57] ABSTRACT

Disclosed is a water-soluble solder flux and a method of fabricating circuit boards which does not adversely affect the insulation resistance of the boards. The flux applied to the board comprises a vehicle including at least two random copolymers of polyalkylene glycol with various amounts of ethylene oxide and propylene oxide. The flux also exhibits a low viscosity for improved copper coverage.

18 Claims, 2 Drawing Sheets

WATER-SOLUBLE FLUX

BACKGROUND OF THE INVENTION

This invention relates to the fabrication of printed circuit boards.

In a standard printed circuit board manufacturing operation, a solder mask is applied to the board so as to expose areas of copper pads which are to be soldered. A flux is then applied to the board, followed by submerging the board in a molten solder bath. Upon removal of the board, blasts of hot air are used to remove excess solder. The boards are then cleaned to eliminate any contaminants.

The fluxes utilized in such processes are usually either rosin-based or water-soluble. Rosin-based fluxes are losing favor since, generally, they must be cleaned off by halogenated hydrocarbon solvents which are harmful to the environment. In terms of environmental protection, therefore, water-soluble fluxes are presently preferred. However, a major problem with most such fluxes is that they can significantly reduce the insulation resistance of the board as a result of flux residues absorbing moisture. They also tend to increase ionic contamination levels and exhibit poor copper coverage.

It is, therefore, an object of the invention to provide a method of fabricating printed circuit boards, including the step of applying a water-soluble solder flux thereto, which results in circuit boards having a high insulation resistance.

It is a further object to provide a water-soluble flux which does not significantly reduce the insulation resistance of boards to which it is applied and which exhibits good copper coverage and lower ionic contamination levels.

SUMMARY OF THE INVENTION

These and other objects are achieved in accordance with the invention which, in one aspect, is a method of fabricating a printed circuit board. A water-soluble flux is applied to at least portions of conductors on a major surface of the board, followed by applying a solder to the conductors. The flux comprises a water-soluble vehicle comprising a mixture of at least two random copolymers of polyalkylene glycol including ethylene oxide and propylene oxide, where the propylene oxide is in the range 10 to 90 percent by weight of the polyalkylene glycol.

In accordance with a further aspect, the invention is a water-soluble flux which comprises a vehicle comprising a mixture of at least two random copolymers of polyalkylene glycol including ethylene oxide and propylene oxide, where the propylene oxide is in the range 10 to 90 percent by weight of the polyalkylene glycol.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
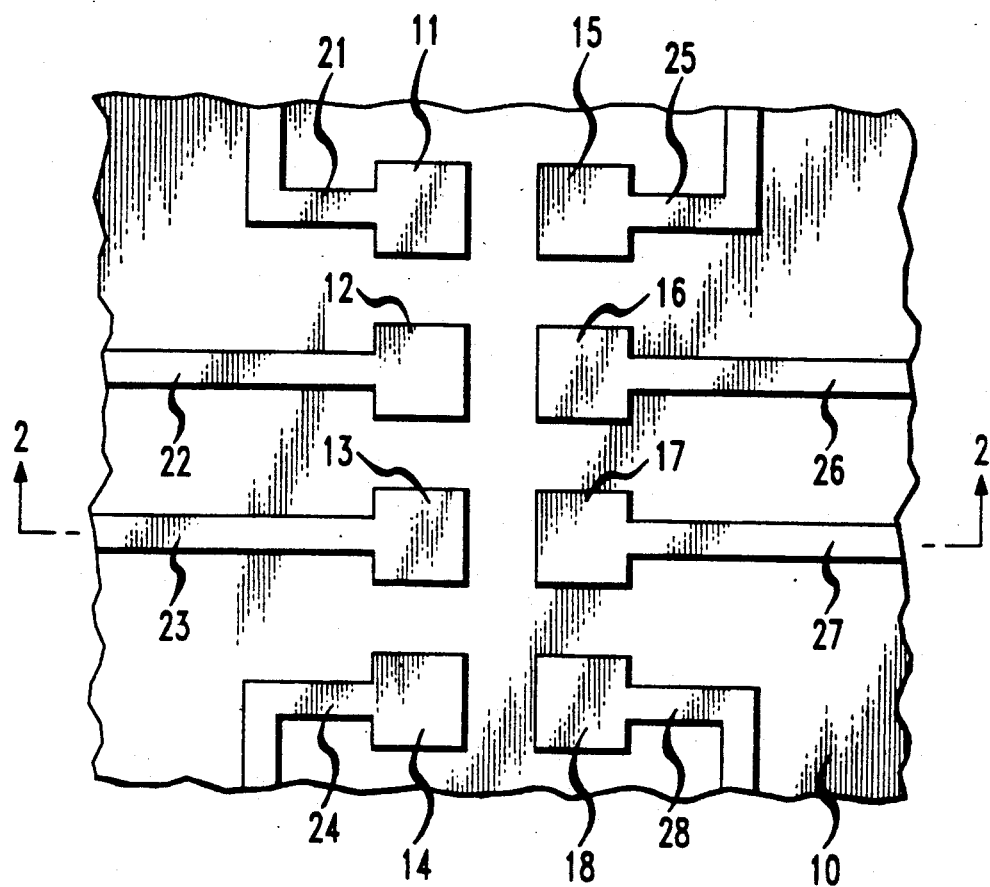
FIG. 1 is a plan view of a portion of a printed circuit board during one stage of fabrication in accordance with an embodiment of the invention.

FIG. 1 illustrates a portion of a printed circuit board, 10, for the purpose of describing the method of the invention. The board typically comprises an epoxy glass composition. The particular portion shown includes an array of bonding pads, 11–18, to which the leads of a standard semiconductor component (not shown) will be surface mounted. Each pad includes an associated conductor, 21–28, extending from the pad to other portions of the circuit on the board. It will be appreciated that the pads and associated conductors are actually formed from a single metal, e.g., copper, during a prior plating operation. The pads and conductors are, typically, approximately 50 microns thick.

Figure 2:
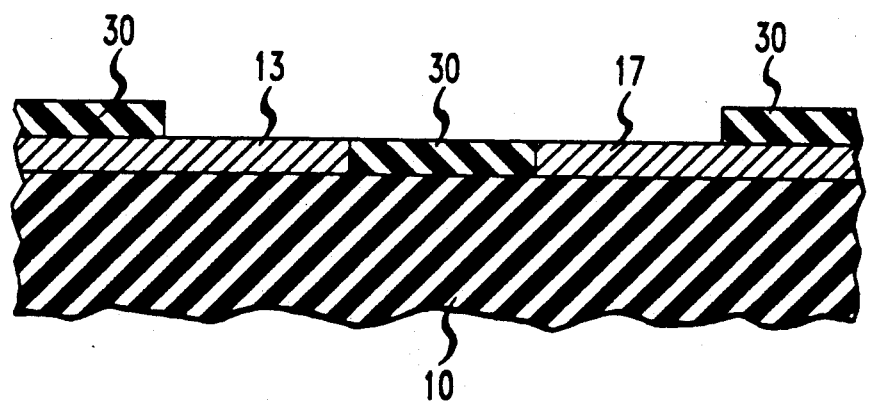
FIGS. 2-4 are cross-sectional views along line 2—2 of FIG. 1 illustrating the circuit board during further stages of fabrication in accordance with the same embodiment.

FIG. 2 illustrates a subsequent stage where a solder mask, 30, is formed over essentially the entire board, 10, including the pads and conductors. The solder mask, 30, an acrylic, polyurethane, epoxy or polyimide coating which is deposited to a thickness of approximately 50 microns.

Standard techniques are employed to expose the areas of metal, in this case the pads, 13 and 17, which are to be soldered, as also shown in FIG. 2.

Figure 3:
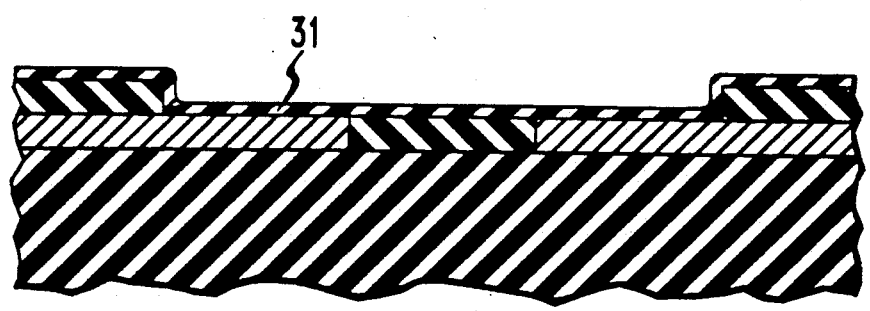

As illustrated in FIG. 3, a solder flux, 31, is applied over essentially the entire area of the board by brushing, rolling or spraying. The flux employed is a water-soluble flux with a composition to be described.

At a subsequent stage in the processing, the board is immersed in a molten solder bath and, upon removing the board, hot air jets are directed toward the board to remove excess solder. A typical solder comprises tin and lead and is usually formed to a thickness in the range 3 to 8 microns.

Figure 4:
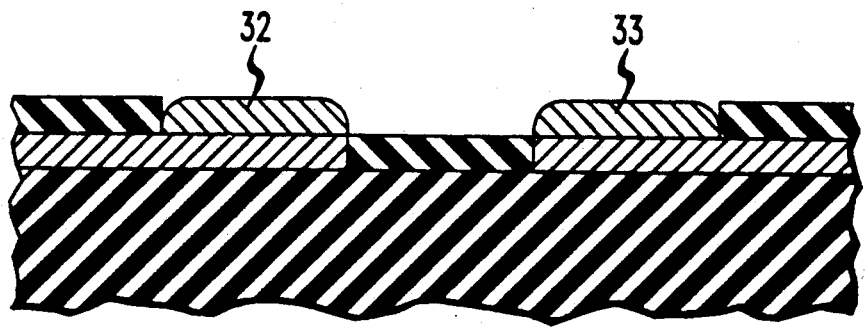

The solder will wet only the exposed areas of metal since the flux, 31, inhibits adhesion of the solder to the solder mask 30. The solder will also push out the areas of the flux which were previously deposited on the exposed metal so that the solder makes direct contact to the metal. The flux residues are then removed by applying water alone or with a suitable detergent. The resulting structure is illustrated in FIG. 4, with the solder, 32 and 33, covering the exposed metal pads, 13 and 17, respectively.

Subsequently, semiconductor components can be bonded to the board by placing the component lead on the appropriate pad and reflowing the solder.

In accordance with a feature of the invention, the flux is a composition which gives particularly desirable results, for example, in terms of maintaining a high surface insulation resistance (SIR) for the printed circuit board, 10. One particular specification (Bellcore Specification TR-TSY-000078), for example, requires a median surface insulation resistance above $3 \times 10^9$ ohms when measured at 35 degrees C. and 85 percent relative humidity. The flux described herein typically maintains a median insulation resistance for the board above $10^{10}$ ohms after the soldering operation on boards which have an initial SIR of $10^{11}$ to $10^{12}$ ohms.

The vehicle of the flux comprises at least two random copolymers of polyalkylene glycol, each including ethylene oxides and propylene oxides, and an antioxidant. In a random copolymer, the ethylene and propylene oxides are formed in a random fashion along the carbon chain. The particular ratio of ethylene and propylene oxides in this polymer is significant for achieving best results. Increasing the propylene oxide content generally improves insulation resistance of the board. However, too much of the propylene oxide can have an adverse effect since the polymer will become less water soluble and less thermally stable. The preferred amount of propylene oxide in each polymer, therefore, was found to be in the range 35 to 75 percent by weight of the polyalkylene glycol, the remainder ethylene oxide. In general, the range of 10 to 90 percent may be used.

In a preferred embodiment, a mixture of two polyalkylene glycols was used to make up the vehicle. The glycols were both linear random copolymers with equal amounts of propylene oxide and ethylene oxide and having one end hydroxyl group. One glycol had a molecular weight of approximately 900 which is sold by Union Carbide under the designation "50HB260," and the other glycol had a molecular weight of approximately 2000 which also is sold by Union Carbide under the designation "50HB660." The ratio of the low molecular weight glycol to the high molecular weight glycol was approximately 3:1 to achieve high insulation resistance, high thermal stability and low viscosity. However, either glycol can be in the range 10 to 90 percent of the mixture. The polyalkylene glycol mixture is generally 50 to 97 weight percent of the flux.

In addition to random polyalkylene glycol, the flux vehicle could also include block copolymers to further protect the solder mask in a solder pot. These block copolymers could be polyoxyethylene and polyoxypropylene such as that sold by BASF under the designation Pluronic L31.

In addition to the polyalkylene glycol, the vehicle also includes an antioxidant. Any of a number of water soluble antioxidants can be employed in the vehicle to improve thermostability and insulation resistance. However, phenothiazine was found to be particularly desirable in increasing insulation resistance. The antioxidant typically comprises 0.25 to 2 weight percent of the flux.

An additional feature of the flux vehicle is that it exhibits low viscosity for improved copper coverage. Preferably, the viscosity is below 200 centipoise (cps), and most advantageously below 100 cps at 25 degrees C.

In order to achieve this low viscosity, low molecular weight polyalkylene glycols are used. However, the molecular weight should not be too low, otherwise the material may exhibit poor thermal stability. Consequently, a molecular weight in the range 500 to 2000 daltons is recommended.

The vehicle generally comprises 60 to 90 percent of the flux, the remainder comprising activators, surfactants and water as described below.

In choosing a suitable acid activator for use in the flux composition, it should be appreciated that the acids need to be easily dissolved in the flux matrix and not leave noticeable residues in the solder pot. Also, the amount of acid used should be enough to clean the copper surfaces to which the flux is applied, but not so much as to deteriorate insulation resistance, increase ionic contamination, or increase flux viscosity to the point of adversely affecting copper coverage.

Consequently, in accordance with a further feature of the invention, the activators consist essentially of a mixture of amine hydro-halides and an organic or inorganic acid. In a preferred embodiment, the activators were hydrobromic acid, glutamic acid hydrochloride and cyclohexyl amine hydrochloride. For the reasons discussed above it is recommended that the amount of hydrobromic acid be in the range 0.5 to 5 weight percent of the flux, and the amount of amine hydro-halides also be in the range 0.5 to 5 weight percent of the flux. Alternatively, the inorganic acid can be employed without any amine hydro-halides.

Hydrochloric acid could be used in place of hydrobromic acid. Also, organic acids such as citric acid and hydroxy acetic acid could be used in place of the inorganic acid.

Other amine hydro-halides which could be used in the activator include: mono-ethanol amine hydrochloride, tri-ethanolamine hydrochloride, betaine hydrochloride, diethylethanol amine hydrochloride, glycine ethylester hydrochloride, and urea hydrochloride.

A suitable surfactant is also recommended to promote uniform spreading of the molten solder on the copper surfaces. Suitable surfactants include: nonionic block copolymers which are a mixture of polyoxypropylene and polyoxyethylene, such as those sold by BASF under the trademark "PLURONIC"; linear alcohol alkoxylate, such as sold by BASF under the trademark "PLURAFAC D-25"; and polyethylene glycol ether, such as sold by Union Carbide under the trademark "TERGITOL TMN-6". The amount of surfactants is usually in the range 0.25 to 25 percent by weight of the flux.

Finally, water is used in the flux composition to dissolve the acids and control the flux viscosity. A suitable amount of water is within the range 3 to 50 percent by weight of the flux.

Since the flux composition according to one aspect of the invention has a relatively low viscosity, it may be desirable in certain solder equipment to drip oil into the solder pots (in addition to the blanketing oil already in the pot) for additional lubrication of the rollers which guide the boards through the pot. Otherwise, the rollers could retain more flux and solder residues than is desirable and cause scumming of the boards. Suitable oils include polyalkylene glycols with a high ethylene oxide content (near 100 percent) and preferably with a branched structure, such as SAF 20 made by Union Carbide. Further, the flux viscosity can be further decreased by warming the flux to about 43 degrees C. before fluxing.

EXAMPLE 1

51 weight percent 50HB260 polyalkylene glycol
17 weight percent 50HB660 polyalkylene glycol
0.5 weight percent phenothiazine
0.8 weight percent hydrobromic acid
0.8 weight percent cyclohexyl amine hydrochloride
0.4 weight percent glutamic acid hydrochloride
0.5 weight percent Pluronic L44 surfactant
30 weight percent water as solvent Such a flux was tested using a standard pattern (see Bellcore Specification TA-TSY-000488, Issue Apr. 1, 1987) which consisted of 21 conductive lines 635 microns wide and spaced 1270 microns apart deposited on a circuit board. The conductive lines were covered by 6 strips of solder mask running in an essentially orthogonal direction thereto. The solder mask strips were 635 microns wide and spaced 635 microns apart. The circuit board initially showed a surface insulation resistance of $10^{12}$ ohms. Subsequent to soldering using the flux, the surface resistance was in the range $10^{10}$ to $10^{11}$ ohms when measured at 35 degrees C. and 85 percent relative humidity. Fluxes generally available in the trade resulted in insulation resistances of $10^8$ to $10^9$ ohms. Also, the amount of exposed copper resulting from the use of the flux of Example 1 was approximately two-thirds of that exhibited by generally available fluxes. Further, solvent extract conductivity, which determines the amount of ions left on the board after cleaning the flux, was tested according to Bellcore Specification TR-NWT-000078, Issue Dec. 3, 1991. Boards using the flux exhibited a conductivity of approximately 0.4 $\mu g/cm^2$ sodium chloride equivalent after aqueous cleaning which was well below the allowable level of 1 $\mu g/cm^2$.

EXAMPLE 2

46 weight percent 50HB260 polyalkylene glycol
19 weight percent 50HB660 polyalkylene glycol
12 weight percent Pluronic L31
0.5 weight percent phenothiazine
0.8 weight percent hydrobromic acid
0.8 weight percent cyclohexyl amine hydrochloride
0.4 weight percent glutamic acid hydrochloride
0.5 weight percent Pluronic L44
20 weight percent water as solvent This example exhibits basically the same advantages as Example 1, but also provides better solder mask protection (i.e., reduces the amount of solder which sticks to the solder mask).

Various modifications of the invention will become apparent to those skilled in the art. All such variations which basically rely on the teachings through which the invention has advanced the art are properly considered within the scope of the invention.

We claim:

1. A method of fabricating a printed circuit board comprising the steps of:
    applying a water-soluble flux to at least portions of conductors on a major surface of the board; and
    applying a solder to the conductors,
    characterized in that the flux comprises a water-soluble vehicle comprising a mixture of at least two linear random copolymers of polyalkylene glycol each including ethylene oxide and propylene oxide, where the propylene oxide is in the range 10 to 90 percent by weight of the polyalkylene glycol.

2. The method according to claim 1 wherein the molecular weight of the vehicle is within the range 500 to 2000 daltons.

3. The method according to claim 1 wherein the viscosity of the vehicle is less than 200 cps at 25 degrees C.

4. The method according to claim 1 wherein the vehicle further comprises an antioxidant.

5. The method according to claim 4 wherein the antioxidant comprises phenothiazine.

6. The method according to claim 1 wherein the flux further comprises a mixture of amine hydro-halides and an acid as an activator.

7. The method according to claim 1 wherein the surface insulation resistance of the board after cleaning off the flux is at least $10^{10}$ ohms when measured at 35 degrees C. and 85 percent relative humidity.

8. The method according to claim 3 wherein the solder is applied by guiding the board into a pot of molten solder and an oil is added to the pot for lubrication of the means for guiding the board.

9. A flux composition comprising:
    a water-soluble vehicle comprising at least two linear random copolymers of polyalkylene glycol each including ethylene oxide and propylene oxide, the propylene oxide being in the range 10 to 90 weight percent of each copolymer.

10. The composition of claim 9 wherein the vehicle further comprises an antioxidant.

11. The composition according to claim 10 wherein the antioxidant comprises phenothiazine.

12. The composition according to claims 9 or 10 wherein the molecular weight of the vehicle is within the range 500 to 2000 daltons.

13. The composition according to claims 9 or 10 wherein the viscosity of the vehicle is less than 200 cps at 25 degrees C.

14. The composition according to claims 9 or 10 further comprising an activator comprising a mixture of amine hydro-halides and an acid.

15. The composition according to claim 14 wherein the activator comprises hydrobromic acid, glutamic acid hydrochloride and cyclohexyl amine hydrochloride.

16. The composition according to claim 15 wherein the amount of hydrobromic acid is within the range of 0.5 to 5 weight percent of the composition, and the combined amount of glutamic acid hydrochloride and cyclohexyl amine hydrochloride is within the range 0.5 to 5 weight percent of the flux.

17. The method according to claim 1 wherein each random copolymer has only one end hydroxyl group.

18. The composition according to claim 9 wherein each random copolymer has only one end hydroxyl group.

* * * * *

UNITED STATES PATENT AND TRADEMARK OFFICE
CERTIFICATE OF CORRECTION

PATENT NO. : 5,215,602
DATED : June 1, 1993
INVENTOR(S) : Mir K. Ali and Chia C. Chang It is certified that error appears in the above-indentified patent and that said Letters Patent is hereby corrected as shown below:

Column 2, line 21, "an acrylic," should read --is an acrylic,--. Column 4, line 57, "Issue Apr. 1," should read --Issue 1, Apr.--; line 60, "6" should read --26--. Column 5, line 8, "Issue Dec. 3, 1991." should read --Issue 3, Dec. 1991.--.

Signed and Sealed this

Eighth Day of March, 1994

Attest:

BRUCE LEHMAN

*Attesting Officer*         *Commissioner of Patents and Trademarks*